US011486041B2

(12) United States Patent
Oikawa

(10) Patent No.: US 11,486,041 B2
(45) Date of Patent: Nov. 1, 2022

(54) FILM FORMING APPARATUS, CONTROL DEVICE, AND PRESSURE GAUGE ADJUSTMENT METHOD

(71) Applicant: TOKYO ELECTRON LIMITED, Tokyo (JP)

(72) Inventor: Masami Oikawa, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/065,355

(22) Filed: Oct. 7, 2020

(65) Prior Publication Data
US 2021/0115562 A1    Apr. 22, 2021

(30) Foreign Application Priority Data
Oct. 18, 2019    (JP) .............................. JP2019-191461

(51) Int. Cl.
| C23C 16/40 | (2006.01) |
| C23C 16/52 | (2006.01) |
| C23C 16/458 | (2006.01) |
| C23C 16/455 | (2006.01) |

(52) U.S. Cl.
CPC ............ C23C 16/52 (2013.01); C23C 16/401 (2013.01); C23C 16/4583 (2013.01); C23C 16/45525 (2013.01)

(58) Field of Classification Search
CPC .......................... C23C 16/52; C23C 16/45544
See application file for complete search history.

(56) References Cited

U.S. PATENT DOCUMENTS

| 2001/0017205 A1* | 8/2001 | Ikeda | ..................... C23C 16/463 165/275 |
| 2005/0090927 A1* | 4/2005 | Tanaka | .............. H01L 21/67276 700/121 |
| 2006/0154383 A1* | 7/2006 | Kannan | ............. C23C 16/45557 438/5 |
| 2006/0216418 A1* | 9/2006 | Matsuura | .......... C23C 16/45542 427/248.1 |
| 2018/0148838 A1* | 5/2018 | Sakane | ............. C23C 16/45536 |

FOREIGN PATENT DOCUMENTS

JP    2014-137275 A    7/2014

* cited by examiner

*Primary Examiner* — Joseph A Miller, Jr.
(74) *Attorney, Agent, or Firm* — Nath, Goldberg & Meyer; Jerald L. Meyer; Tanya E. Harkins

(57) ABSTRACT

A film forming apparatus includes: a pressure-reducible processing container; a pressure gauge configured to detect a pressure in the processing container; and a controller, wherein the controller is configured to repeat a cycle including a step of adjusting a zero point of the pressure gauge and a step of executing a film forming process in the processing container until an ultimate pressure, which is detected by the pressure gauge when an interior of the processing container is evacuated to a highest reachable vacuum degree after the step of executing the film forming process, reaches a target range.

13 Claims, 5 Drawing Sheets

FILM FORMING APPARATUS, CONTROL DEVICE, AND PRESSURE GAUGE ADJUSTMENT METHOD

CROSS-REFERENCE TO RELATED APPLICATION

This application is based upon and claims the benefit of priority from Japanese Patent Application No. 2019-191461, filed on Oct. 18, 2019, the entire contents of which are incorporated herein by reference.

TECHNICAL FIELD

The present disclosure relates to a film forming apparatus, a control device, and a pressure gauge adjustment method.

BACKGROUND

Among diaphragm-type pressure measurement devices for measuring the pressure inside a pressure-reducible pressing container, there is known a pressure measurement device capable of reducing, even when a solid is attached to the diaphragm, the influence of stress exerted by the attached solid on the deformation of the diaphragm (see, for example, Patent Document 1).

PRIOR ART DOCUMENT

Patent Document

Patent Document 1: Japanese Laid-Open Patent Publication No. 2014-137275

SUMMARY

According to one embodiment of the present disclosure, there is provided a film forming apparatus including: a pressure-reducible processing container; a pressure gauge configured to detect a pressure in the processing container; and a controller, wherein the controller is configured to repeat a cycle including a step of adjusting a zero point of the pressure gauge and a step of executing a film forming process in the processing container until an ultimate pressure, which is detected by the pressure gauge when an interior of the processing container is evacuated to a highest reachable vacuum degree after the step of executing the film forming process, reaches a target range.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
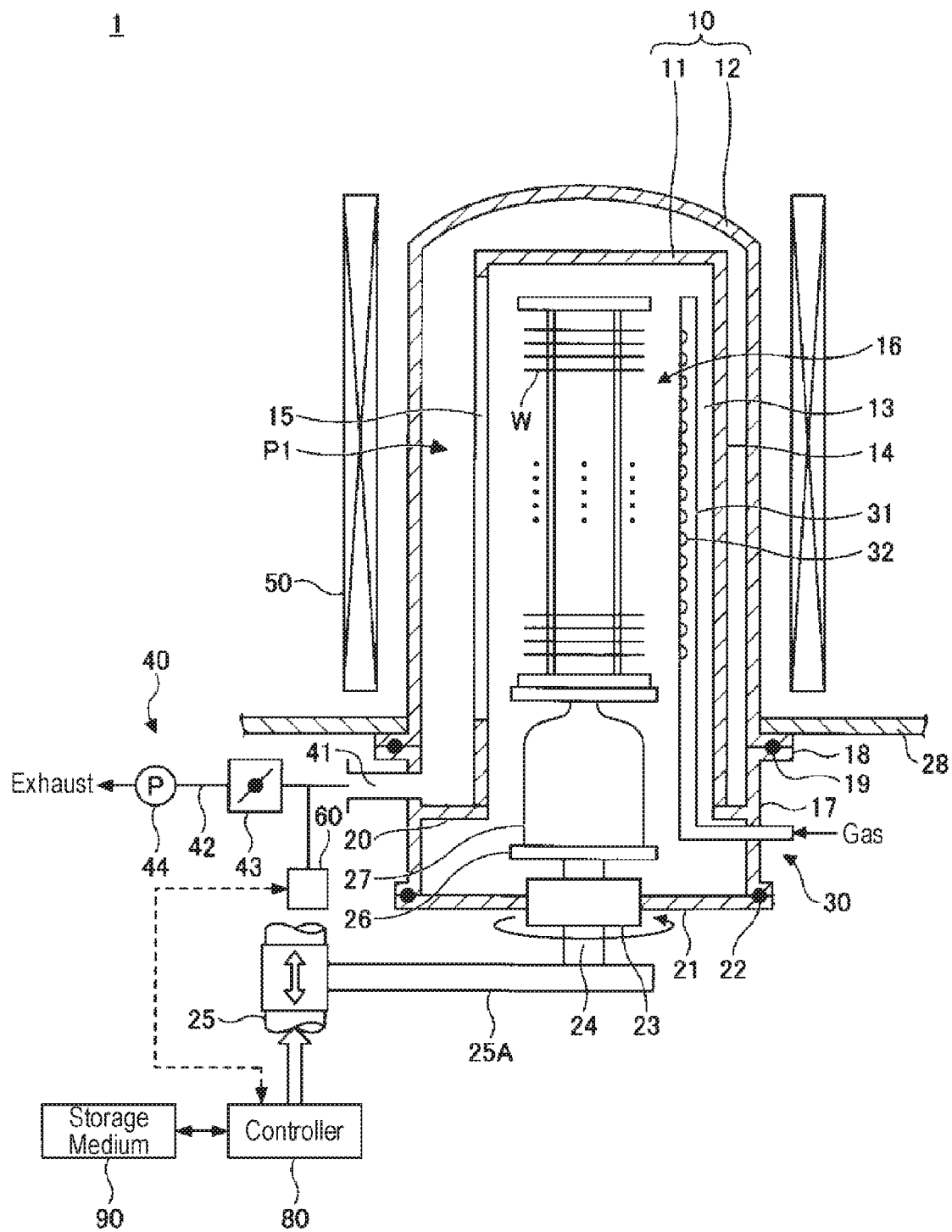
FIG. 1 is a schematic view illustrating an exemplary configuration of a film forming apparatus according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. In all of the accompanying drawings, the same or corresponding members or components will be denoted by the same or corresponding reference numerals, and redundant explanations will be omitted.

[Film Forming Apparatus]

FIG. 1 is a schematic view illustrating an exemplary configuration of a film forming apparatus according to an embodiment. As illustrated in FIG. 1, a film forming apparatus 1 includes, for example, a processing container 10, a gas supply part 30, an exhaust part 40, a heater 50, a pressure gauge 60, and a controller 80.

The processing container 10 is pressure-reducible and accommodates a semiconductor wafer (hereinafter referred to as a "wafer W"), which is a substrate. The processing container 10 has a cylindrical inner tube 11 having a ceiling and a lower open end, and a cylindrical outer tube 12 having a lower open end and a ceiling covering the outside of the inner tube 11. The inner tube 11 and the outer tube 12 are formed of a heat-resistant material such as quartz, and are arranged coaxially so as to form a double-tube structure.

The ceiling of the inner tube 11 is, for example, flat. On one side of the inner tube 11, an accommodation part 13 configured to accommodate a gas nozzle is installed along the longitudinal direction (vertical direction) of the inner tube 11. In an embodiment, a portion of the side wall of the inner tube 11 protrudes outward so as to form a convex portion 14, and the inside of the convex portion 14 is formed as the accommodation portion 13.

In the side wall of the inner tube 11 opposite the nozzle accommodation part 13, a rectangular opening 15 is formed in the longitudinal direction thereof (the vertical direction). The opening 15 is a gas exhaust port formed so as to be capable of exhausting the gas within the inner tube 11. The length of the opening 15 is equal to the length of a wafer boat 16, or extends in the vertical direction to be longer than the length of the wafer boat 16.

The lower end of the processing container 10 is supported by a cylindrical manifold 17 formed of, for example, stainless steel. A flange 18 is formed at the upper end of the manifold 17, and the lower end of the outer tube 12 is installed and supported on the flange 18. A seal member 19, such as an O-ring, is interposed between the flange 18 and the lower end of the outer tube 12 such that the inside of the outer tube 12 is hermetically sealed.

An annular support part 20 is installed in the inner wall of the upper portion of the manifold 17, and the lower end of the inner tube 11 is installed and supported on the support part 20. A lid 21 is hermetically installed to the opening at the lower end of the manifold 17 via a sealing member 22, such as an O-ring, so as to hermetically close the opening at the lower end of the processing container 10, that is, the opening of the manifold 17. The lid 21 is formed of, for example, stainless steel.

A rotary shaft 24 configured to rotatably support the wafer boat 16 via a magnetic fluid seal 23 is installed in the central portion of the lid 21. The lower portion of the rotary shaft 24 is rotatably supported by an arm 25A of a lift mechanism 25 configured as a boat elevator.

A rotary plate 26 is installed at the upper end of the rotary shaft 24, and the wafer boat 16 that holds wafers W is placed on the rotary plate 26 via a quartz heat insulating base 27. Therefore, by moving the lift mechanism 25 up and down, the lid 21 and the wafer boat 16 integrally move up and down so that the wafer boat 16 can be inserted into and removed from the inside of the processing container 10. The wafer boat 16 is a substrate holder that is capable of being accommodated in the processing container 10 and holds a plurality of wafers W substantially horizontally at predetermined intervals in the vertical direction.

The gas supply part 30 is installed in the manifold 17. The gas supply part 30 introduces gases, such as a film forming gas, a cleaning gas, and a purge gas, into the inner tube 11. The gas supply part 30 has a gas nozzle 31.

The gas nozzle 31 is made of, for example, quartz, and is installed within the inner tube 11 in the longitudinal direction of the inner tube 11. The base end of the gas nozzle 31 is bent in an L shape and passes through the manifold 17 so as to be supported. The gas nozzle 31 has a plurality of gas holes 32 formed along the longitudinal direction thereof, and a gas is ejected horizontally from the gas holes 32. The gas holes 32 are arranged, for example, at the same interval as the interval between the wafers W supported by the wafer boat 16. The gas nozzle 31 is a nozzle that supplies a gas, such as a film forming gas, a cleaning gas, or a purge gas, and supplies the gas into the processing container 10 as necessary while controlling the flow rate.

The film forming gas is a gas for forming a film on the wafers W, and is selected according to the type of film to be formed. For example, when forming a silicon oxide film, a silicon source gas and an oxidizing gas may be used as film forming gases.

Examples of the silicon source gas include aminosilane gases such as diisopropylaminosilane (DIPAS), trisdimethylaminosilane (3DMAS), tetrakis(dimethylamino)silane (4DMAS), and bis(tertiary-butylamino)silane (BTBAS).

Examples of the oxidizing gas includes $O_2$ gas, $O_3$ gas), $CO_2$ gas. NO gas, $N_2O$ gas, and $H_2O$ gas, and these gases are plasmarized by a radio-frequency electric field so as to be used as oxidizing species, if necessary. As the oxidizing species, $O_2$ plasma is preferable. When $O_3$ gas) is used, plasma is unnecessary.

The cleaning gas is a gas for removing the film deposited in the interior of the processing container 10. Examples of the cleaning gas may include fluorine-containing gases, such as HF gas, $F_2$ gas, and $ClF_3$ gas.

The purge gas is a gas for removing and purging the film forming gas and the cleaning gas remaining in the processing container 10. Examples of the purge gas may include inert gases such as nitrogen gas and argon gas.

In addition, in the example of FIG. 1, the case in which the gas supply part 30 has one gas nozzle 31 has been described, but the form of the gas supply part 30 is not limited thereto. For example, the gas supply part 30 may have a plurality of gas nozzles therein.

The exhaust part 40 exhausts the gas discharged from the inside of the inner tube 11 through the opening 15 and discharged from the gas outlet 41 through the space P1 between the inner tube 11 and the outer tube 12. The gas outlet 41 is formed in the upper sidewall of the manifold 17 and above the support part 20. An exhaust passage 42 is connected to the gas outlet 41. A pressure adjustment valve 43 and a vacuum pump 44 are sequentially interposed in the exhaust passage 42 so as to evacuate the inside of the processing container 10.

The heater 50 is installed around the outer tube 12. The heater 50 is installed, for example, on the base plate 28. The heater 50 has a cylindrical shape so as to cover the outer tube 12. The heater 50 includes, for example, a heating element, and heats the wafers W in the processing container 10.

The pressure gauge 60 is installed in the upstream side of the pressure adjustment valve 43 in the exhaust passage 42, and detects the pressure in the processing container 10. The pressure gauge 60 may be, for example, a diaphragm vacuum gauge. The pressure gauge 60 transmits a detected pressure to the controller 80. Further, the zero point of the pressure gauge 60 is automatically adjusted by the controller 80.

The controller 80 is an example of a control device, and controls the operation of the film forming apparatus 1. The controller 80 may be, for example, a computer. A computer program for executing the overall operation of the film forming apparatus 1 is stored in a storage medium 90. The storage medium 90 may be, for example, a flexible disc, a compact disc, a hard disc, flash memory, or a DVD.

[Operation of Film Forming Apparatus]

First, as an example of the operation of the film forming apparatus 1, a film forming process for forming a silicon oxide film on wafers W will be described.

At normal temperature, a wafer boat 16 accommodating, for example, 50 to 150 wafers W is loaded into the processing container 10, the temperature of which is controlled, by raising the wafer boat 16 from the lower side of the processing container 10. In addition, the inside of the processing container 10 is sealed by closing the opening at the lower end of the manifold 17 with the lid 21. The wafers W have a diameter of, for example, 30 mm.

Subsequently, the inside of the processing container 10 is evacuated to maintain the process pressure, and the power supplied to the heater 50 is controlled so as to raise the wafer temperature to maintain the process temperature at a temperature of, for example, 450 degrees C. or lower. Then, the film forming process is started in a state in which the wafer boat 16 is rotated.

The film forming process is a process of forming a silicon oxide film on wafers W by, for example, so-called atomic layer deposition (ALD) in which a step of supplying a silicon source gas and a step of supplying an oxidizing gas are alternately repeated. Further, the film forming process may include a step of removing the gas remaining in the processing container 10 (hereinafter referred to as "residual gas") from the inside of the processing container 10 between the step of supplying the silicon source gas and the step of supplying the oxidizing gas.

In the step of supplying the silicon source gas, the silicon source gas is adsorbed onto the wafers W by supplying the silicon source gas into the processing container 10 through the gas holes 32 in the gas nozzle 31. The time for which the silicon source gas is supplied in the step of supplying the silicon source gas is, for example, 1 to 180 sec, the flow rate of the silicon source gas is, for example, 1 to 1000 sccm, and the pressure in the processing container 10 is, for example, 13.3 to 1333 Pa (0.1 to 10 Torr).

In the step of supplying the oxidizing gas, the silicon source gas adsorbed on the wafers W is oxidized by supplying the oxidizing gas from the gas holes 32 of the gas nozzle 31 into the processing container 10. At this time, if necessary, radio-frequency power may be applied to plasmarizing the oxidizing gas to generate oxygen radicals so as to oxidize the silicon source gas adsorbed on the wafers W. The time for supplying the oxidizing gas in the step of supplying the oxidizing gas is, for example, 1 to 300 sec, the flow rate of the oxidizing gas is, for example, 100 to 20000 sccm, and the pressure in the processing container 10 is, for example, 13.3 to 1333 Pa (0.1 to 10 Torr). The frequency of the radio-frequency power when applying the radio-frequency power is, for example, 13.56 MHz, and the power is, for example, 5 to 1000 W.

In the step of removing the residual gas, the purge gas is supplied into the processing container 10 through the gas holes 32 of the gas nozzle 31 while the processing container 10 is evacuated. The step of removing the residual gas is performed, for example, after the step of supplying the silicon source gas and after the step of supplying the oxidizing gas. The time for supplying the purge gas in the step of removing the residual gas is, for example, 1 to 60 sec, the flow rate of the purge gas is, for example, 50 to 20000 sccm, and the pressure in the processing container 10 is, for example, 13.3 to 1333 Pa (0.1 to 10 Torr). In the step of removing the residual gas, for example, the evacuation may be continued without supplying the purge gas in a state in which the supply of all the gases is stopped. However, it is possible to remove the residual gas in the processing container 10 in a short time by supplying the purge gas.

In this manner, by repeating the step of intermittently supplying the silicon raw material and the step of supplying the oxidizing gas alternately with the step of removing the residual gas from the inside of the processing container 10 interposed therebetween, it is possible to form a silicon oxide film having a desired film thickness. After the film forming process is finished, the wafers W are unloaded from the inside of the processing container 10 in the reverse order of the procedure of loading the wafers W into the processing container 10.

Next, as another example of the operation of the film forming apparatus 1, a cleaning process for removing the film deposited in the processing container 10 will be described.

In the cleaning process, in a state in which the wafer boat 16, which does not accommodate product wafers W, is placed on the heat insulating base 27, the wafer boat 16 is loaded into the processing container 10, which is heated to a set temperature, by being raised from the lower side of the processing container 10. Subsequently, the inside of the processing container 10 is sealed by closing the opening in the lower end of the manifold 17 with the lid 21. Subsequently, the cleaning gas is supplied into the processing container 10 through the gas holes 32 of the gas nozzle 31 while the processing container 10 is evacuated. As a result, reaction products attached to, for example, the inner wall of the processing container 10, the wafer boat 16, the heat insulating base 27, and the gas nozzle 31, are removed. The temperature in the processing container 10 during the cleaning process is, for example, 0 to 600 degrees C., preferably 25 to 475 degrees C.

[Pressure Gauge]

Figure 2:
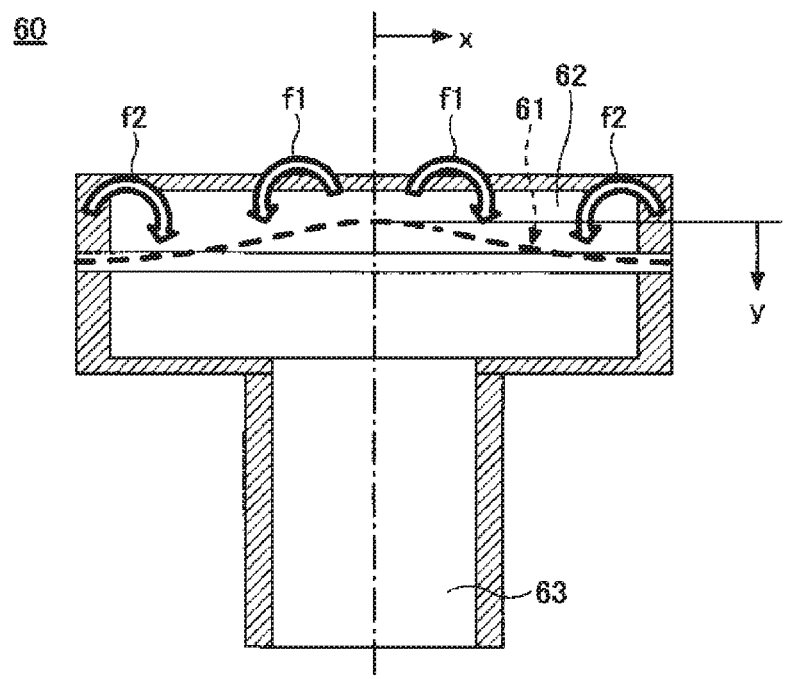
FIG. 2 is a view illustrating an exemplary pressure gauge.

FIG. 2 is a view illustrating an exemplary pressure gauge 60. As illustrated in FIG. 2, the pressure gauge 60 is a diaphragm vacuum gauge that detects deformation of a diaphragm 61 disposed at a boundary between a reference pressure chamber 62 and a measurement pressure chamber 63 communicating with the inside of the processing container 10, thereby measuring the pressure in the measurement pressure chamber 63.

The diaphragm 61 is bent due to the pressure difference between one side surface and the other side surface thereof. That is, the diaphragm 61 is deformed axially symmetrically about the center thereof. For example, when the pressure of the measurement pressure chamber 63 is higher than the internal pressure of the reference pressure chamber 62, the central portion of the diaphragm 61 is moved (deformed) upward (the −y direction in the drawing).

In the diaphragm 61, when the gas flowing into the measurement pressure chamber 63 contains solids (e.g., particles), and when the solids are attached to the surface of the diaphragm 61, stress is generated in the surface of the diaphragm 61 by the solids attached thereto. In the diaphragm 61, for example, when the attached solids form a film and the film contracts, contraction stress is generated on the surface of the diaphragm 61. At this time, when the pressure is measured based on the deformation of the diaphragm 61, the generated stress is a positive shift stress (f in the drawing) that causes the measured pressure to be excessively high, or a negative shift stress that causes the pressure to be measured to be excessively low (f2 in the drawing). As described above, in the pressure gauge 60, when the solids are attached to the surface of the diaphragm 61, an error is included in the deformation of the diaphragm 61 due to the pressure difference, and the accuracy with which the pressure is measured decreases.

[Pressure Gauge Adjustment Method]

Figure 3:
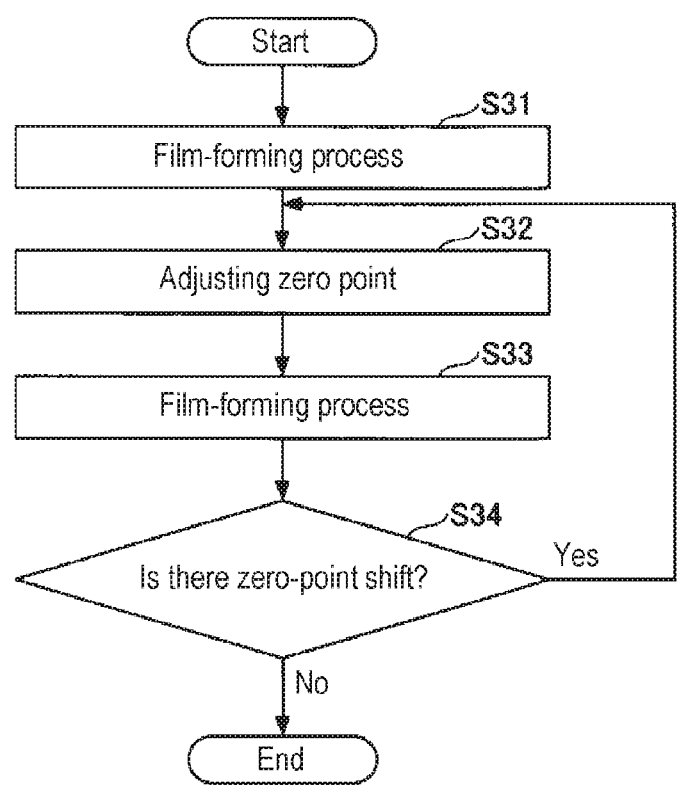
FIG. 3 is a flowchart illustrating a method of adjusting a pressure gauge according to an embodiment.

FIG. 3 is a flowchart illustrating a method of adjusting the pressure gauge 60 according to an embodiment. The method of adjusting the pressure gauge 60 according to the embodiment is executed, for example, after the cleaning process. The cleaning process is performed, for example, each time when a film forming process is performed multiple times.

As illustrated in FIG. 3, the method of adjusting the pressure gauge 60 according to the embodiment includes steps S31 to S34.

In step S31, the controller 80 executes the film forming process in the processing container 10. In an embodiment, the controller 80 executes the film forming process in a state in which the wafers W are not present in the processing container 10 or dummy wafers are accommodated in the processing container 10. In step S31, some of the film forming gas supplied into the processing container 10 during the film forming process flows into the measurement pressure chamber 63 of the pressure gauge 60, and a film is deposited on the surface of the diaphragm 61. The film forming process in step S31 is performed using, for example, the same gas as the film forming gas used in the film forming process in which the product wafers are accommodated in the processing container 10. Further, the film forming process in step S31 is preferably executed under, for example, the same conditions as the film forming process executed while accommodating the product wafers in the processing container 10. The film forming process may be, for example, a process of forming a silicon oxide film by alternately supplying an aminosilane gas and an oxidizing gas into the processing container 10.

In step S32, the controller 80 adjusts the zero point of the pressure gauge 60. In an embodiment, the controller 80 controls the exhaust part 40 to evacuate the inside of the processing container 10 to the highest reachable vacuum degree. Subsequently, the controller 80 detects the pressure in the processing container 10 evacuated to the highest reachable vacuum degree (hereinafter, referred to as an "ultimate pressure") using the pressure gauge 60. Subsequently, the controller 80 adjusts the zero point of the pressure gauge 60 such that the ultimate pressure detected by the pressure gauge 60 becomes a target pressure. The target pressure may be, for example, the ultimate pressure detected by the pressure gauge 60 when the difference between the ultimate pressures detected by the pressure gauge 60 before and after the film forming process is within a predetermined range. In addition, the target pressure may be, for example, the ultimate pressure detected by the pressure gauge 60 in a state in which a film having a predetermined thickness or more is deposited on the surface of the diaphragm 61 of the pressure gauge 60. The target pressure may be, for example, the ultimate pressure detected by the pressure gauge 60 immediately before the cleaning process for removing, for example, the film deposited in the processing container 10.

In step S33, the controller 80 executes the film forming process in the processing container 10. The film forming process in step S33 may be the same as the film forming process in step S31.

In step S34, the controller 80 determines whether there is a zero-point shift in the pressure gauge 60. In an embodiment, the controller 80 controls the exhaust part 40 to evacuate the inside of the processing container 10 to the highest reachable vacuum degree. Subsequently, the controller 80 detects the pressure in the processing container 10 evacuated to the highest reachable vacuum degree using the pressure gauge 60. Subsequently, the controller 80 determines whether or not the ultimate pressure detected by the pressure gauge 60 has reached a target range. When it is determined that the ultimate pressure detected by the pressure gauge 60 has reached the target range, the controller 80 determines that there is no zero-point shift in the pressure gauge 60, and finishes the process. Meanwhile, when it is determined that the ultimate pressure detected by the pressure gauge 60 has not reached the target range, the controller 80 determines that there is a zero-point shift in the pressure gauge 60, and returns the process to step S32.

Figure 4:
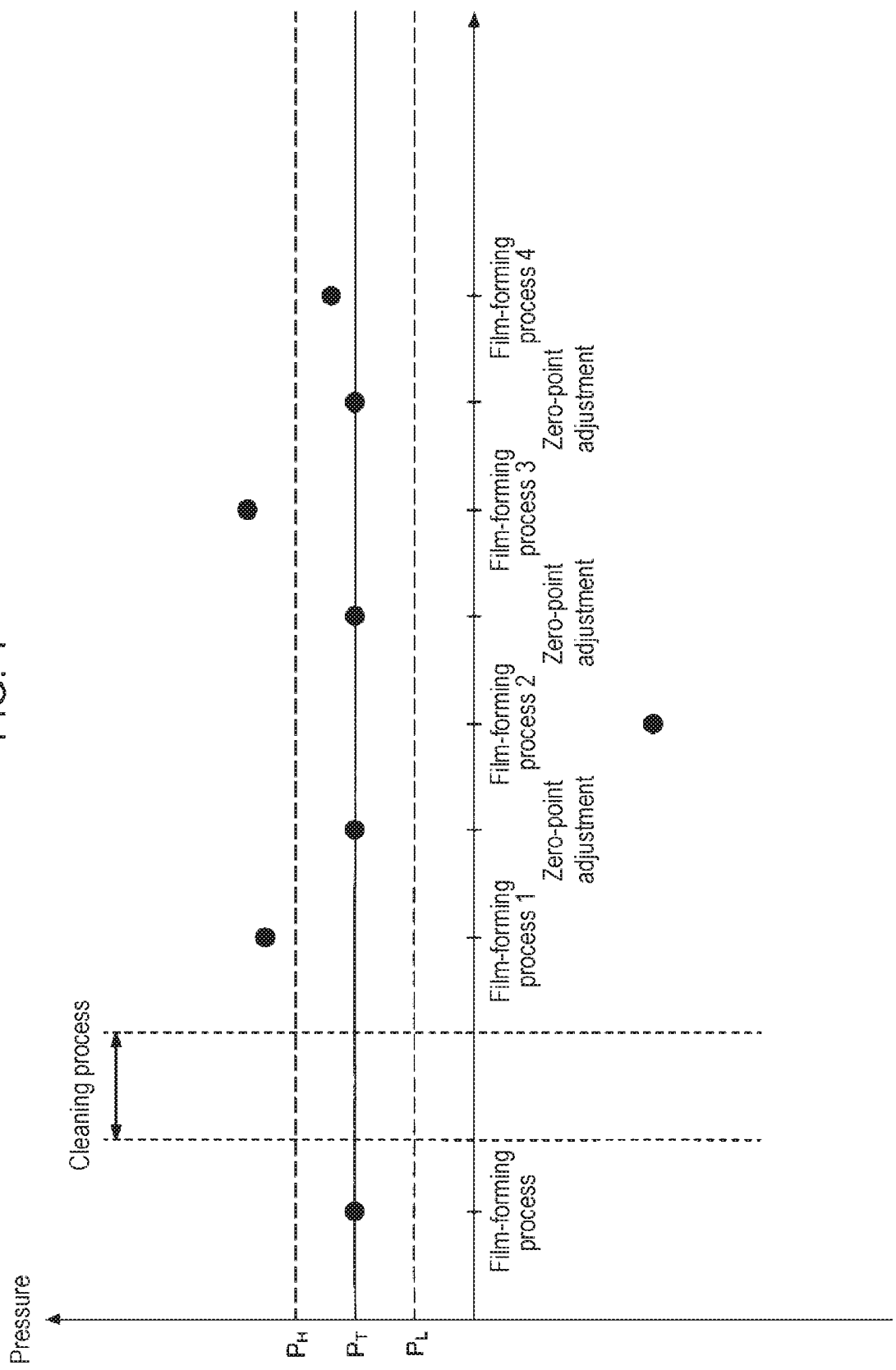
FIG. 4 is a view illustrating a specific example of the method of adjusting a pressure gauge according to an embodiment.

Next, a specific example of the method of adjusting the pressure gauge 60 according to the embodiment will be described. FIG. 4 is a view illustrating a specific example of the method of adjusting the pressure gauge 60 according to the embodiment. In FIG. 4, the target pressure PT is indicated by a solid line, and the upper limit value $P_H$ and the lower limit value $P_L$ of the target range are indicated by broken lines. In the example of FIG. 4, the target pressure PT is the ultimate pressure after the film forming process executed immediately before the cleaning process. DIPAS was used as the film forming gas during the film forming process, $O_2$ plasma was used as the oxidizing gas, and HF gas was used as the cleaning gas during the cleaning process.

As illustrated in FIG. 4, the ultimate pressure after the film forming process 1 (step S31) performed after the cleaning process is higher than the upper limit $P_H$ of the target range. The ultimate pressure after the zero-point adjustment (step S32) executed after the film forming process 1 (step S31) is the target pressure PT, and the ultimate pressure after the film forming process 2 (step S33) executed after the zero-point adjustment (step S32) has a value lower than the lower limit value $P_L$ of the target range. Therefore, it is determined in step S34 that there is a zero-point shift, and the zero-point adjustment (step S32) is performed again.

The ultimate pressure after the second zero-point adjustment (step S32) is the target pressure PT, and the ultimate pressure after the film forming process 3 (step S33) executed after the zero-point adjustment (step S32) has a value higher than the upper limit value $P_H$ of the target range. Therefore, it is determined in step S34 that there is a zero-point shift, and the zero-point adjustment (step S32) is performed again.

The ultimate pressure after the third zero-point adjustment (step S32) is the target pressure Pr, and the ultimate pressure after the film forming process 4 (step S33) executed after the zero-point adjustment (step S32) has a value that falls within the target range. Therefore, it is determined in step S34 that there is no zero-point shift, and the process is finished.

As described above, in an embodiment, the controller 80 repeats a cycle including the step of adjusting the zero point of the pressure gauge 60 and the step of executing the film forming process in the processing container 10 until the ultimate pressure after the step of executing the film forming process reaches the target range. By automating the zero-point adjustment of the pressure gauge 60 in this way, it is possible to reduce downtime accompanying with the adjustment of the pressure gauge 60. This improves productivity. Further, it is possible to reduce a difference in devices that may occur when an operator manually adjusts the zero point of the pressure gauge 60.

[System Including Film Forming Apparatus]

Figure 5:
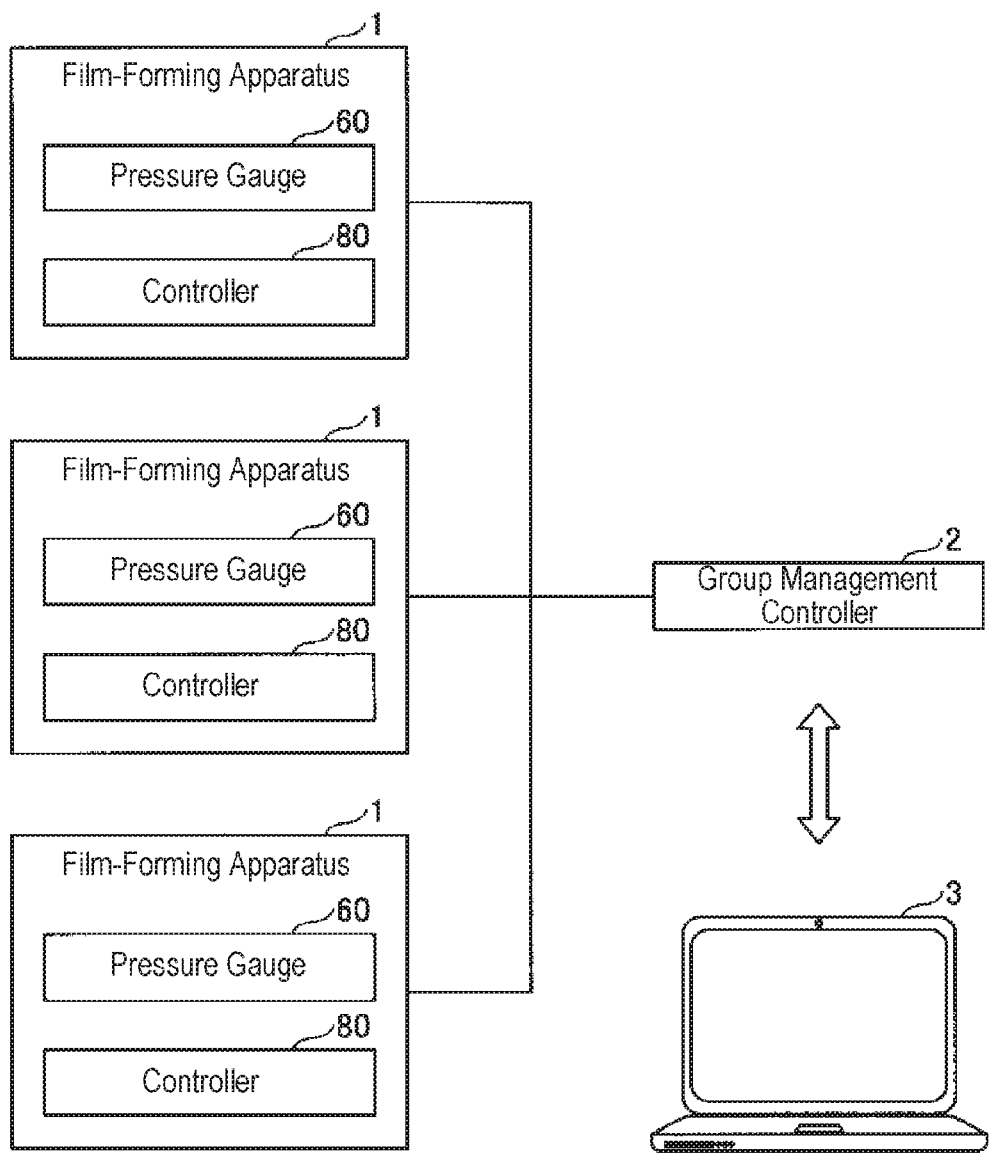
FIG. 5 is a view illustrating an exemplary system including a film forming apparatus.

FIG. 5 is a view illustrating an exemplary system including the film forming apparatus 1. As illustrated in FIG. 5, the system includes three film forming apparatuses 1, a group management controller 2, and a terminal 3.

Each film forming apparatus 1 has a pressure gauge 60 and a controller 80. Each film forming apparatus 1 is communicatively connected to the group management controller 2 via a communication line in a semiconductor factory. Although three film forming apparatuses 1 are illustrated in FIG. 5, the number of film forming apparatuses 1 is not particularly limited.

The group management controller 2 is an example of a control device, and may be, for example, a computer. The group management controller 2 is communicatively connected to the terminal 3 via a communication line of a semiconductor factory. The group management controller 2 acquires log data when the film forming apparatus 1 executes a process, and stores the acquired log data. The log data includes a detection value of the pressure gauge 60. Further, the group management controller 2 may be configured to execute the method of adjusting the pressure gauge 60 according to the embodiment together with or in place of the controller 80 described above.

The communication line is separated from, for example, an external network. However, the communication line may be communicatively connected to the external network.

It should be understood that the embodiments disclosed herein are illustrative and are not limiting in all aspects. The above-described embodiments may be omitted, replaced, or modified in various forms without departing from the scope and spirit of the appended claims.

In the embodiments described above, the case in which the processing container is a container having a double-tube structure has been described, but the present disclosure is not limited thereto. For example, the processing container may be a container having a single-tube structure.

In the embodiments described above, the case in which the processing apparatus is an apparatus that supplies gas from the gas nozzle arranged in the longitudinal direction of the processing container and exhausts the gas from the slit arranged to face the gas nozzles has been described, but the present disclosure is not limited thereto. For example, the processing apparatus may be an apparatus that supplies gas from a gas nozzle arranged along the longitudinal direction of the wafer boat and exhausts the gas from an exhaust port arranged above the wafer boat. In addition, for example, the processing apparatus may be an apparatus that supplies a processing gas from a gas nozzle arranged below the processing container and exhausts the gas from an exhaust port arranged above the processing container.

In the embodiments described above, the case in which the heater is installed around the processing container has been described, but the present disclosure is not limited thereto. For example, the heater may not be provided.

In the embodiments described above, the case in which the processing apparatus is an apparatus that does not use plasma has been described, but the present disclosure is not limited thereto. For example, the processing apparatus may be an apparatus that uses plasma such as capacitively coupled plasma (CCP).

In the embodiments described above, the case in which the processing apparatus is a batch-type apparatus that performs a process on a plurality of wafers at one time has been described, but the present disclosure is not limited thereto. For example, the processing apparatus may be a single-wafer processing apparatus that processes wafers one by one. Further, for example, the processing apparatus may be a semi-batch-type apparatus that causes a plurality of wafers placed on a rotary table within a processing container to revolve such that the wafers sequentially pass through an area in which a first gas is supplied and an area in which a second gas is supplied, thereby processing the wafers.

In the embodiments described above, the case in which the substrate is a semiconductor wafer has been described, but the present disclosure is not limited thereto. For example, the substrate may be a large substrate for a flat panel display (FPD), a substrate for an organic EL panel, or a substrate for a solar cell.

According to the present disclosure, it is possible to automatically execute zero-point adjustment of a pressure gauge.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming apparatus comprising:
a pressure-reducible processing container;
a pressure gauge configured to detect a pressure in the processing container; and
a controller,
wherein the controller is configured to repeat a cycle including a step of adjusting a zero point of the pressure gauge and a step of executing a film forming process in the processing container until an ultimate pressure, which is detected by the pressure gauge when an interior of the processing container is evacuated to a highest reachable vacuum degree after the step of executing the film forming process, reaches a target range,
wherein the controller is configured to finish the cycle without performing the step of adjusting the zero point of the pressure gauge when the ultimate pressure is within the target range, and
wherein the step of executing the film forming process is performed in a state in which no substrate is present in the processing container or in a state in which a dummy substrate is accommodated in the processing container.

2. The film forming apparatus of claim 1, wherein in the step of adjusting the zero point, the zero point of the pressure gauge is adjusted such that the ultimate pressure becomes a target pressure.

3. The film forming apparatus of claim 2, wherein the target pressure is a pressure detected by the pressure gauge when a film having a predetermined thickness or more is deposited on the pressure gauge.

4. The film forming apparatus of claim 3, wherein the controller is configured to execute the cycle after a cleaning process for removing a film deposited in the interior of the processing container, and
the target pressure is a pressure detected by the pressure gauge immediately before the cleaning process.

5. The film forming apparatus of claim 4, wherein the pressure gauge is a diaphragm vacuum meter configured to detect deformation of a diaphragm disposed at a boundary between a reference pressure chamber and a measurement pressure chamber communicating with the interior of the processing container, thereby measuring a pressure of the measurement pressure chamber.

6. The film forming apparatus of claim 5, wherein the film forming process includes a process of forming a silicon oxide film by alternately supplying an aminosilane gas and an oxidizing gas into the processing container.

7. The film forming apparatus of claim 6, wherein the processing container is a container configured to accommodate a substrate holder configured to hold a plurality of substrates horizontally at intervals in a vertical direction.

8. The film forming apparatus of claim 2, wherein the controller is configured to execute the cycle after a cleaning process for removing a film deposited in the interior of the processing container, and
the target pressure is the pressure detected by the pressure gauge immediately before the cleaning process.

9. The film forming apparatus of claim 1, wherein the pressure gauge is a diaphragm vacuum meter configured to detect deformation of a diaphragm disposed at a boundary between a reference pressure chamber and a measurement pressure chamber communicating with the interior of the processing container, thereby measuring a pressure of the measurement pressure chamber.

10. The film forming apparatus of claim 1, wherein the film forming process includes a process of forming a silicon oxide film by alternately supplying an aminosilane gas and an oxidizing gas into the processing container.

11. The film forming apparatus of claim 1, wherein the processing container is a container configured to accommodate a substrate holder configured to hold a plurality of substrates horizontally at intervals in a vertical direction.

12. A control device for adjusting a pressure gauge that detects a pressure in a processing container of a film forming apparatus,
wherein the control device is configured to repeat a cycle including a step of adjusting a zero point of the pressure gauge and a step of executing a film forming process in the processing container until an ultimate pressure, which is detected by the pressure gauge when an interior of the processing container is evacuated to a highest reachable vacuum degree after the step of executing the film forming process, reaches a target range, and wherein the control device is configured to finish the cycle without performing the step of adjusting the zero point of the pressure gauge when the ultimate pressure is within the target range, and wherein the step of executing the film forming process is performed in a state in which no substrate is present in the processing container or in a state in which a dummy substrate is accommodated in the processing container.

13. A method for adjusting a pressure of a film forming apparatus comprising a pressure-reducible processing container, a pressure gauge configured to detect a pressure in the processing container, and a controller, the method comprising:

repeating a cycle including a step of adjusting a zero point of the pressure gauge and a step of executing a film forming process in the processing container, until an ultimate pressure, which is detected by the pressure gauge when an interior of the processing container is evacuated to a highest reachable vacuum degree after the step of executing the film forming process, reaches a target range, wherein the cycle finishes without performing the step of adjusting the zero point of the pressure gauge when the ultimate pressure is within the target range, and wherein the step of executing the film forming process is performed in a state in which no substrate is present in the processing container or in a state in which a dummy substrate is accommodated in the processing container.

* * * * *